US011592873B2

United States Patent
Xiang et al.

(10) Patent No.: US 11,592,873 B2
(45) Date of Patent: Feb. 28, 2023

(54) DISPLAY STACK TOPOLOGIES FOR UNDER-DISPLAY OPTICAL TRANSCEIVERS

(71) Applicant: Apple Inc., Cupertino, CA (US)

(72) Inventors: Xiao Xiang, Cupertino, CA (US); Tong Chen, Cupertino, CA (US); Fan Gui, San Jose, CA (US); Mark T. Winkler, San Jose, CA (US); Ran Tu, San Jose, CA (US); Tsu-Hui Lin, San Jose, CA (US); Wenrui Cai, San Jose, CA (US); Yun Wang, Cupertino, CA (US)

(73) Assignee: Apple Inc., Cupertino, CA (US)

(*) Notice: Subject to any disclaimer, the term of this patent is extended or adjusted under 35 U.S.C. 154(b) by 257 days.

(21) Appl. No.: 16/791,905

(22) Filed: Feb. 14, 2020

(65) Prior Publication Data
US 2021/0255668 A1 Aug. 19, 2021

(51) Int. Cl.
G06F 1/16 (2006.01)
G06F 3/042 (2006.01)
G06F 3/041 (2006.01)

(52) U.S. Cl.
CPC .......... G06F 1/1643 (2013.01); G06F 1/1626 (2013.01); G06F 3/042 (2013.01); G06F 3/0412 (2013.01)

(58) Field of Classification Search
CPC .... G06F 1/1643; G06F 1/1626; G06F 3/0412; G06F 3/02
See application file for complete search history.

(56) References Cited

U.S. PATENT DOCUMENTS

| | | |
|---|---|---|
| 5,231,689 A | 7/1993 | Reidinger |
| 6,349,159 B1 | 2/2002 | Uebbing et al. |

(Continued)

FOREIGN PATENT DOCUMENTS

| | | |
|---|---|---|
| CN | 105531653 | 4/2016 |
| CN | 107180853 | 9/2017 |

(Continued)

OTHER PUBLICATIONS

U.S. Appl. No. 16/905,664, filed Jun. 18, 2020, Chen et al.
(Continued)

*Primary Examiner* — Patrick N Edouard
*Assistant Examiner* — Eboni N Giles
(74) *Attorney, Agent, or Firm* — Brownstein Hyatt Farber Schreck, LLP

(57) ABSTRACT

In some embodiments, a display stack includes a set of light-emitting elements, and a display backplane that includes a set of conductors and is electrically coupled to the set of light-emitting elements. A conductor in the set of conductors has a length, and a curved edge extending along at least a portion of the length. In some embodiments, a display stack includes a set of light-emitting elements; a set of transistors, electrically coupled to the set of light-emitting elements; and a set of conductors, electrically coupled to the set of transistors. The set of transistors may be electrically coupled to the set of conductors at a set of conductive pads. A plurality of conductive pads in the set of conductive pads is coupled to a single conductor in the set of conductors. The single conductor approaches different conductive pads in the plurality of conductive pads at different angles.

16 Claims, 13 Drawing Sheets

(56) References Cited

U.S. PATENT DOCUMENTS

| | | |
|---|---|---|
| 6,529,661 B2 | 3/2003 | Kropp |
| 6,556,349 B2 | 4/2003 | Cox et al. |
| 6,586,776 B1 | 7/2003 | Liu |
| 6,910,812 B2 | 6/2005 | Pommer |
| 6,919,681 B2 | 7/2005 | Cok et al. |
| 6,946,647 B1 | 9/2005 | O'Neill et al. |
| 6,948,820 B2 | 9/2005 | Veligdan et al. |
| 7,021,833 B2 | 4/2006 | Loh |
| 7,444,083 B2 | 10/2008 | Ohashi et al. |
| 7,499,094 B2 | 3/2009 | Kuriyama |
| 7,706,073 B2 | 4/2010 | Munro |
| RE41,673 E | 9/2010 | Ma |
| 8,077,393 B2 | 12/2011 | Steenblik |
| 8,603,642 B2 | 12/2013 | Hatwar et al. |
| 8,664,655 B2 | 3/2014 | Lee et al. |
| 8,743,027 B2 | 6/2014 | Wu et al. |
| 8,780,065 B2 | 7/2014 | Ribeiro et al. |
| 9,007,349 B2 | 4/2015 | Tseng |
| 9,064,451 B2 | 6/2015 | Lynch et al. |
| 9,112,043 B2 | 8/2015 | Arai |
| 9,183,779 B2 | 11/2015 | Soto |
| 9,342,181 B2 | 5/2016 | Wyatt et al. |
| 9,530,381 B1 | 12/2016 | Bozarth et al. |
| 9,570,002 B2 | 2/2017 | Sakariya et al. |
| 9,614,168 B2 | 4/2017 | Zhang et al. |
| 9,741,286 B2 | 8/2017 | Sakariya et al. |
| 9,762,329 B2 | 9/2017 | Motohara |
| 9,870,075 B2 | 1/2018 | Han et al. |
| 9,909,862 B2 | 3/2018 | Ansari et al. |
| 10,073,228 B2 | 9/2018 | Polleux et al. |
| 10,079,001 B2 | 9/2018 | Hodges |
| 10,090,574 B2 * | 10/2018 | Wu ............ H01P 3/08 |
| 10,115,000 B2 | 10/2018 | Mackey et al. |
| 10,222,475 B2 | 3/2019 | Pacala |
| 10,290,266 B2 | 5/2019 | Kurokawa |
| 10,331,939 B2 | 6/2019 | He et al. |
| 10,410,037 B2 | 9/2019 | He et al. |
| 10,453,381 B2 | 10/2019 | Kurokawa |
| 10,474,286 B2 | 11/2019 | Bae et al. |
| 10,565,734 B2 | 2/2020 | Bevensee et al. |
| 10,614,279 B2 | 4/2020 | Kim et al. |
| 10,664,680 B2 | 5/2020 | Xu et al. |
| 10,713,458 B2 | 7/2020 | Bhat et al. |
| 10,748,476 B2 | 8/2020 | Zhao et al. |
| 10,809,853 B2 | 10/2020 | Klenkler et al. |
| 10,838,556 B2 | 11/2020 | Yeke Yazdandoost et al. |
| 10,872,222 B2 | 12/2020 | Gao et al. |
| 10,903,901 B2 | 1/2021 | Mitchell |
| 2003/0148391 A1 | 8/2003 | Salafsky |
| 2004/0022677 A1* | 2/2004 | Wohlstadter ......... G01N 21/253 422/52 |
| 2004/0209116 A1 | 10/2004 | Ren et al. |
| 2005/0094931 A1 | 5/2005 | Yokoyama et al. |
| 2007/0040627 A1* | 2/2007 | Kanno .............. H01P 3/081 333/4 |
| 2012/0113357 A1 | 5/2012 | Cheng et al. |
| 2013/0113733 A1 | 5/2013 | Lim et al. |
| 2013/0231046 A1* | 9/2013 | Pope ............ G06F 3/0416 455/41.1 |
| 2015/0309385 A1 | 10/2015 | Shu et al. |
| 2017/0214004 A1* | 7/2017 | Shedletsky ......... H01L 27/3269 |
| 2017/0270342 A1* | 9/2017 | He ................ G06V 40/1318 |
| 2018/0032778 A1 | 2/2018 | Lang |
| 2018/0323243 A1 | 11/2018 | Wang |
| 2019/0034686 A1 | 1/2019 | Ling et al. |
| 2019/0130155 A1 | 5/2019 | Park |
| 2019/0165333 A1* | 5/2019 | Harada ............ H01L 51/0097 |
| 2019/0221624 A1 | 7/2019 | Lin et al. |
| 2019/0293849 A1 | 9/2019 | Du et al. |
| 2020/0051499 A1 | 2/2020 | Chung et al. |
| 2020/0209729 A1 | 7/2020 | Chen et al. |
| 2020/0241138 A1 | 7/2020 | Allen et al. |
| 2020/0265206 A1 | 8/2020 | Chung et al. |
| 2020/0293741 A1 | 9/2020 | Du |
| 2020/0342194 A1 | 10/2020 | Bhat et al. |
| 2021/0014429 A1 | 1/2021 | Alasirnio et al. |
| 2021/0050385 A1 | 2/2021 | Chuang et al. |
| 2021/0064159 A1 | 3/2021 | Yeke Yazdandoost et al. |
| 2021/0089741 A1 | 3/2021 | Yeh et al. |
| 2021/0091342 A1 | 3/2021 | Chen et al. |
| 2021/0287602 A1 | 9/2021 | Chen et al. |
| 2021/0396935 A1 | 12/2021 | Chen et al. |
| 2022/0035200 A1 | 2/2022 | Chen et al. |

FOREIGN PATENT DOCUMENTS

| | | |
|---|---|---|
| CN | 107271404 | 10/2017 |
| CN | 107330426 | 11/2017 |
| CN | 107515435 | 12/2017 |
| CN | 108292361 | 7/2018 |
| CN | 108885693 | 11/2018 |
| CN | 109074475 | 12/2018 |
| CN | 109791325 | 5/2019 |
| CN | 109983471 | 7/2019 |
| DE | 202004002512 | 3/2005 |
| EP | 2463927 | 8/2013 |
| EP | 3171254 | 5/2017 |
| EP | 3404484 | 11/2018 |
| EP | 3438880 | 2/2019 |
| JP | H0642898 | 2/1994 |
| JP | 6127447 | 5/2017 |
| KR | 20050022260 | 3/2005 |
| WO | WO 17/204777 | 11/2017 |
| WO | WO 18/093798 | 5/2018 |
| WO | WO 18/186580 | 10/2018 |
| WO | WO 18/210317 | 11/2018 |

OTHER PUBLICATIONS

U.S. Appl. No. 16/945,643, filed Jul. 31, 2020, Chuang et al.
U.S. Appl. No. 16/945,174, filed Jul. 31, 2020, Chen et al.
U.S. Appl. No. 16/376,987, filed Apr. 5, 2019, Yeke Yazdandoost et al.
U.S. Appl. No. 16/723,850, filed Dec. 20, 2019, Chen et al.
U.S. Appl. No. 17/003,636, filed Aug. 26, 2020, Yeh et al.
U.S. Appl. No. 17/003,732, filed Aug. 26, 2020, Chen et al.
U.S. Appl. No. 17/006,708, filed Aug. 28, 2020, Ran et al.
U.S. Appl. No. 17/028,775, filed Sep. 22, 2020, Yeke Yazdandoost et al.
Gelinck et al., "X-Ray Detector-on-Plastic With High Sensitivity Using Low Cost, Solution-Processed Organic Photodiodes," IEEE, 2015, pp. 1-8.
Garcia de Arquer et al., "Solution-processed semiconductors for next-generation photodetectors," *Nature Reviews—Materials*, 2017, vol. 2, No. 16100, pp. 1-16.
U.S. Appl. No. 17/466,813, filed Sep. 3, 2021, Vulis et al.

* cited by examiner

DISPLAY STACK TOPOLOGIES FOR UNDER-DISPLAY OPTICAL TRANSCEIVERS

FIELD

The described embodiments relate to electronic devices (e.g., smartphones, tablet computers, laptop computers, wearable devices, standalone or wall-mounted display screens, and other devices) having under-display optical transceivers, and to display stack topologies that can improve the performance of such under-display optical transceivers.

BACKGROUND

In some cases, it may be desirable to determine whether an object or user is proximate to a device, to determine the distance between an object or user and a device, or to determine a velocity or acceleration of an object or user with respect to a device. It may also be desirable to capture a two-dimensional (2D) or three-dimensional (3D) image of an object or user that is proximate to a device. In some cases, the 2D or 3D image may be an image of a fingerprint, a face, or a scene in a field of view (FoV). In some cases, it may be useful to wirelessly transmit or receive information between devices. It may also be useful to acquire images or data pertaining to a device's environment. In all of these cases, the measurements, images, or other data may be sensed or acquired optically.

SUMMARY

Embodiments of the systems, devices, methods, and apparatus described in the present disclosure are directed to under-display optical transceivers. In accordance with described techniques, an optical transceiver may be positioned under (or behind) a device's display, and light may be transmitted and received through translucent apertures extending from a front surface to a back surface of the display. In this manner, an optical transceiver may transmit and receive "through" a display. When an optical transceiver is positioned under a device's display, a portion of the device's display surface does not have to be reserved for the optical transceiver, and in some cases the device's display area may be increased.

In a first aspect, the present disclosure describes a device including a display stack. The display stack may include a set of light-emitting elements, and a display backplane that includes a set of conductors and is electrically coupled to the set of light-emitting elements. A conductor in the set of conductors may have a length, and a curved edge extending along at least a portion of the length.

In another aspect, the present disclosure describes another display stack. The display stack may include a set of light-emitting elements; a set of transistors, electrically coupled to the set of light-emitting elements; and a set of conductors, electrically coupled to the set of transistors. The set of transistors may be electrically coupled to the set of conductors at a set of conductive pads. A plurality of conductive pads in the set of conductive pads may be coupled to a single conductor in the set of conductors. The single conductor may approach a first conductive pad in the plurality of conductive pads at a first angle, and approach a second conductive pad in the plurality of conductive pads at a second angle.

In still another aspect of the disclosure, an electronic device is described. The electronic device may include a first set of conductors disposed in a first layer, and a second set of conductors disposed in a second layer. The first layer and the second layer may be stacked. A first conductor in the first set and a second conductor in the second set may have edges that overlap at a non-perpendicular angle.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
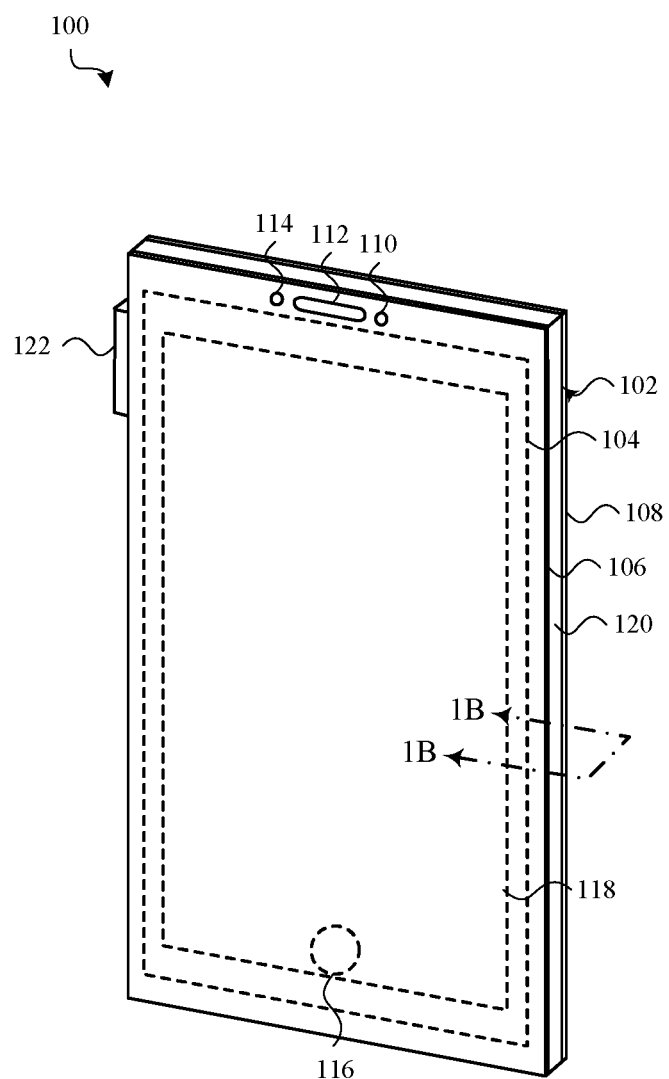
FIGS. 1A and 1B show an example embodiment of a device having a display and an under-display optical transceiver.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

To maximize the display area of an electronic device, an optical transceiver may be positioned behind the active area of a device's display. An optical transceiver (or optical sensing transceiver) may be variously configured or deployed as: a proximity sensor (or ranging sensor); a two-dimensional (2D) or three-dimensional (3D) camera in combination with a flood illuminator or structured light source; a bio-authentication sensor (e.g., an infrared (IR) facial recognition sensor or fingerprint sensor); an eye/gaze tracker, device tracker, or other optical tracking system; an optical communication system or wireless communicator or controller; a time-of-flight (ToF) sensor (e.g., a short pulse optical source and a single-photon avalanche-diode (SPAD) detector or SPAD array); and so on.

When an optical transceiver is positioned under a device's display, an area adjacent the display does not have to be reserved for one or more components of the transceiver (e.g., the transceiver's transmitter or receiver), and in some cases the size of the device's display area may be increased. However, an impediment to positioning an optical sensor under a display is the inclusion of many opaque, partially non-transmissive, or laterally non-transmissive elements in the display stack. Opaque, partially non-transmissive, or laterally non-transmissive elements may include, for example, light-emitting elements, drive circuits or the transistors thereof, conductive traces that route electrical signals to the drive circuits, optical, electrical, physical, and/or chemical shielding or confining elements, touch sensing and/or force sensing metal traces, and so on.

For purposes of this disclosure, light-emitting elements are deemed to include semiconductor light-emitting elements, such as light-emitting diodes (LEDs); semiconductor-driven electroluminescent light-emitting elements, such as organic LEDs (OLEDs) that include organic materials charged by thin-film transistors; and other types of light-emitting elements. Elements in an OLED display that may be opaque, partially non-transmissive, or laterally non-transmissive include, for example, organic light-emitting elements, the anode(s) and/or cathode(s) that contact the organic light-emitting elements, the thin-film transistors (TFTs) used to drive (or in some cases sense or otherwise control) the organic light-emitting elements, and the TFT metal traces that route signals to or from the TFTs, anode(s), and/or cathode(s).

The multiple layers of opaque, partially non-transmissive, or laterally non-transmissive elements in a display stack can reflect, absorb, diffuse, or diffract light entering the front or back surface of the display stack, and can provide high transmission loss (low throughput) for light passing through the display stack. In fact, the density of opaque, partially non-transmissive, or laterally non-transmissive elements in a display stack can make the display stack seem relatively opaque and function as a high-loss optical mask. Furthermore, the small feature size (e.g., micrometer (μm) scale) of opaque, partially non-transmissive, or laterally non-transmissive elements (e.g., anode(s), cathode(s), TFT metal traces, and touch metal traces), in combination with their density, tends to increase the reflectivity of the display stack and increase the extent to which light diffracts as it passes between and around elements in the display stack. In some cases, a display stack may allow approximately 1-2% of visible light to pass, and allow approximately 1-4% of infrared light to pass.

One potential solution to this is to fabricate some of the display stack's opaque elements (e.g., the conductive traces) as transparent elements. For example, conductive traces may be made of indium-tin-oxide (ITO). However, transparent elements are often associated with undesirable costs, such as higher sheet resistance. Furthermore, and in the case of OLED displays, a highly reflective and largely opaque surface is needed under the light-emitting elements of the OLED to maximize OLED optical extraction. Also, transparent conductive traces may allow organic material to be exposed to optical radiation from an under-display optical emitter, which can cause the organic material to heat, glow, age, degrade, and so on.

Of particular concern for an under-display optical transceiver, and especially an under-OLED display optical transceiver, are the conductive traces (e.g., anode metal traces) that route electrical signals to or from the TFTs (or to/from the drive or sense circuits) that are used to drive, sense, or otherwise control the display's light-emitting elements. The conductive traces may provide power and control signals to the light-emitting elements (or pixels), and may read data from the pixels (e.g., from the thin-film transistor(s) (TFT(s)) of every of pixel). The conductive traces are typically included in multiple layers of the display stack, and may be oriented in different directions (e.g., orthogonal or otherwise overlapping directions) such that they form a mesh of conductive traces. In some cases, the conductive traces may cover 85-95% of the surface area of a display stack, and may thus prevent light from passing through approximately 85-95% of a display stack. This greatly reduces the signal-to-noise ratio (SNR) and dynamic range of an optical transceiver positioned in an under-display configuration. The conductive traces are not only opaque, but in many cases are highly reflective. Furthermore, the number and density of the conductive traces can cause them to act as a diffraction grating.

As a result of their properties individually, and their layout collectively, the conductive traces within a display stack can lead to significant crosstalk between the optical transmission and optical reception components of an under-display optical transceiver, which may further reduce the SNR and dynamic range of the optical transceiver. Still further, the regular pitch of the TFT metal traces (usually equal to an integer or fraction of the display's pixel pitch) can make the mesh of TFT metal traces an effective diffraction grating. Regardless, there exist translucent (and sometimes transparent) apertures between the conductive traces, and some of these translucent apertures typically extend from the front surface to the back surface of a display stack.

The reflective properties of the conductive traces and other components within a display stack, alone or in combination with the diffraction effects caused by these components, can also increase the incidence of direct crosstalk between an optical emitter and an optical receiver (i.e., crosstalk caused by the propagation of light from an optical emitter to an optical receiver, without the light ever reflecting or scattering off an object or medium that is external to the device that includes the display stack). Measurements have shown that, in some cases, the increase in the incidence of direct crosstalk can be an order of magnitude or more greater than the incidence of direct crosstalk for an optical emitter and optical transceiver positioned directly below a transparent cover (e.g., a cover glass).

The present disclosure describes systems, devices, methods, and apparatus in which the topology of a display stack is optimized to mitigate the incidence of direct crosstalk between an optical emitter and an optical receiver (e.g., components of an under-display optical transceiver) positioned under a display.

These and other embodiments are discussed with reference to FIGS. 1A-7. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include, A, or B, or A and B.

Figure 1B:
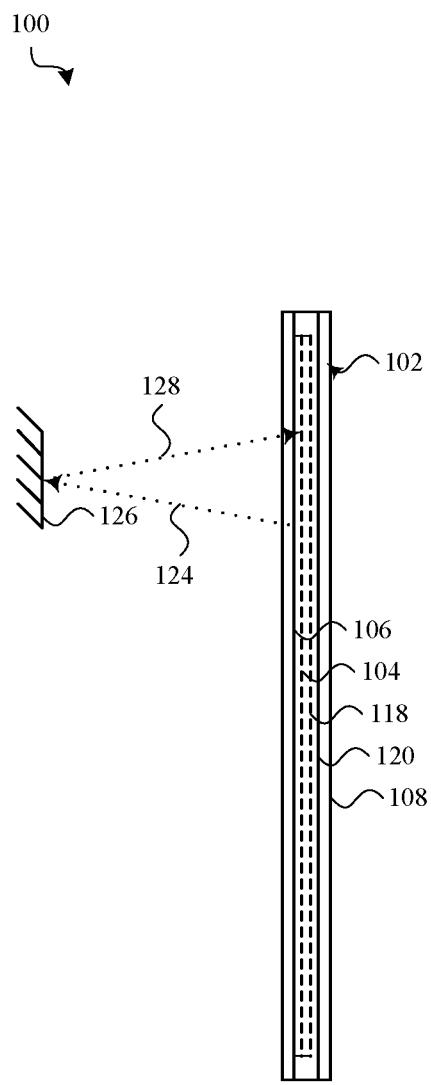

FIGS. 1A and 1B show an example of a device 100 having a display 104 and an under-display optical transceiver 118. More particularly, FIG. 1A shows a perspective view of the front of the device 100, and FIG. 1B shows an elevation of a side of the device 100 (taken from the view of sight line 1B-1B in FIG. 1A). The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device, including, for example, a mobile phone, tablet computer, laptop computer, portable music player, health monitoring device, wearable device (e.g., an electronic watch or health monitoring device), portable terminal, or other portable or mobile device. The device 100 could also be a device that is semi-permanently located or installed at a single location (e.g., a display screen, security screen, control screen, electronic kiosk display, or television).

The device 100 may include a housing 102 that at least partially surrounds or supports a display 104. In some examples, the housing 102 may include or support a front cover 106 and/or a rear cover 108. The front cover 106 may be positioned over the display 104, and may provide a window through which the display 104 may be viewed. In some embodiments, the display 104 may be attached to (or abut) the housing 102 and/or the front cover 106.

The front of the device 100 may include one or more front-facing cameras 110, speakers 112, microphones, or other components 114 (e.g., audio, imaging, or sensing components) that are configured to transmit or receive signals to/from the device 100. In some cases, a front-facing camera 110, alone or in combination with other sensors, may be configured to operate as a bio-authentication sensor (e.g., a facial recognition sensor). The device 100 may also include various input devices, including a mechanical or virtual button 116 which may be accessible from the front surface (or display surface) of the device 100. In some cases, the front-facing camera 110, virtual button 116, and/or other sensors of the device 100 may be integrated with a display stack of the device 100 and positioned under the display 104. For example, the front-facing camera(s) 110, virtual button 116, and/or other components may be provided by one or more optical transceivers 118 positioned under the display 104. An under-display optical transceiver 118 may also be configured as (or provide) a proximity sensor; a 2D or 3D camera in combination with a flood illuminator or structured light source; a bio-authentication sensor (e.g., a facial recognition sensor or fingerprint sensor); an eye/gaze tracker, device tracker, or other optical tracking system; an optical communication system; and so on.

The device 100 may also include buttons or other input devices positioned along a sidewall 120 of the housing 102 and/or on a rear surface of the device 100. For example, a volume button or multipurpose button 122 may be positioned along the sidewall 120, and in some cases may extend through an aperture in the sidewall 120. By way of example, the rear surface of the device 100 may include a rear-facing camera or other optical sensor. A flash or light source may also be positioned along the rear of the device 100 (e.g., near the rear-facing camera). In some cases, the rear surface of the device 100 may include multiple rear-facing cameras.

The display 104 may include one or more light-emitting elements including, for example, LEDs, OLEDs, a liquid crystal display (LCD), an electroluminescent display (EL), or other types of light-emitting elements. The display 104 may also include, or be associated with, one or more touch and/or force sensors that are configured to detect a touch and/or a force applied to a surface of the front cover 106.

The various components of the housing 102 may be formed from the same or different materials. For example, the sidewall 120 may be formed using one or more metals (e.g., stainless steel), polymers (e.g., plastics), ceramics, or composites (e.g., carbon fiber). In some cases, the sidewall 120 may be a multi-segment sidewall including a set of antennas. The antennas may form structural components of the sidewall 120. The antennas may be structurally coupled (to one another or to other components) and electrically isolated (from each other or from other components) by one or more non-conductive segments of the sidewall 120. The front cover 106 may include, for example, one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover) may be coated with an opaque ink to obscure components included within the housing 102. The rear cover 108 may be formed using the same material(s) that are used to form the sidewall 120 or the front cover 106. In some cases, the rear cover 108 may be part of a monolithic element that also forms the sidewall 120 (or in cases where the sidewall 120 is a multi-segment sidewall, those portions of the sidewall 120 that are non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 120 to cover an opening defined by the sidewall 120 (i.e., an opening into an interior volume in which various electronic components of the device 100, including the display 104 and optical transceiver 118, may be positioned). The front cover 106 may be mounted to the sidewall 120 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensing system) may be configured to detect a touch applied to an outer surface of the front cover 106 (e.g., to a display surface of the device 100).

In some cases, a force sensor (or part of a force sensing system) may be positioned within the interior volume below and/or to the side of the display 104. In some cases, the force sensor (or force sensing system) may be triggered in response to the touch sensor detecting one or more touches on the front cover 106 (or a location or locations of one or more touches on the front cover 106), and may determine an amount of force associated with each touch, or an amount of force associated with the collection of touches as a whole. Alternatively, operation of the touch sensor (or touch sensing system) may be triggered in response to the force sensor (or force sensing system) detecting an amount of force (e.g., an amount of force exceeding a threshold amount) on the front cover 106. Alternatively, the force sensor (or force sensing system) may be configured to detect a location or centroid of one or more touches, thereby functioning as both a force sensor and a touch sensor.

FIG. 1B shows light 124 being emitted from an optical transmitter (or optical emitter) of an optical transceiver 118 positioned under (or behind) the display 104. The emitted light 124 may travel from the optical transmitter toward the front cover 106, and may pass through the front cover 106. After passing through the front cover 106, the emitted light 124 may travel toward an object 126, such as a user's finger, face, or ear, reflect from the object 126, and travel back toward the device 100 as reflected light 128. The reflected light 128 may pass through the display 104 and be received by an optical receiver of the optical transceiver 118. A processor of the device 100 may then determine a proximity of the object 126 to the device 100. The processor may also or alternatively make other determinations based on the emitted and received light 124, 128, or based on light received (but not emitted) by the device 100. For example, the processor may analyze a 2D or 3D image acquired by the optical transceiver 118; or enroll or authenticate a user's face or fingerprint; or determine the distance or direction to, or the topography, position, or motion of, the object 126.

Figure 2A:
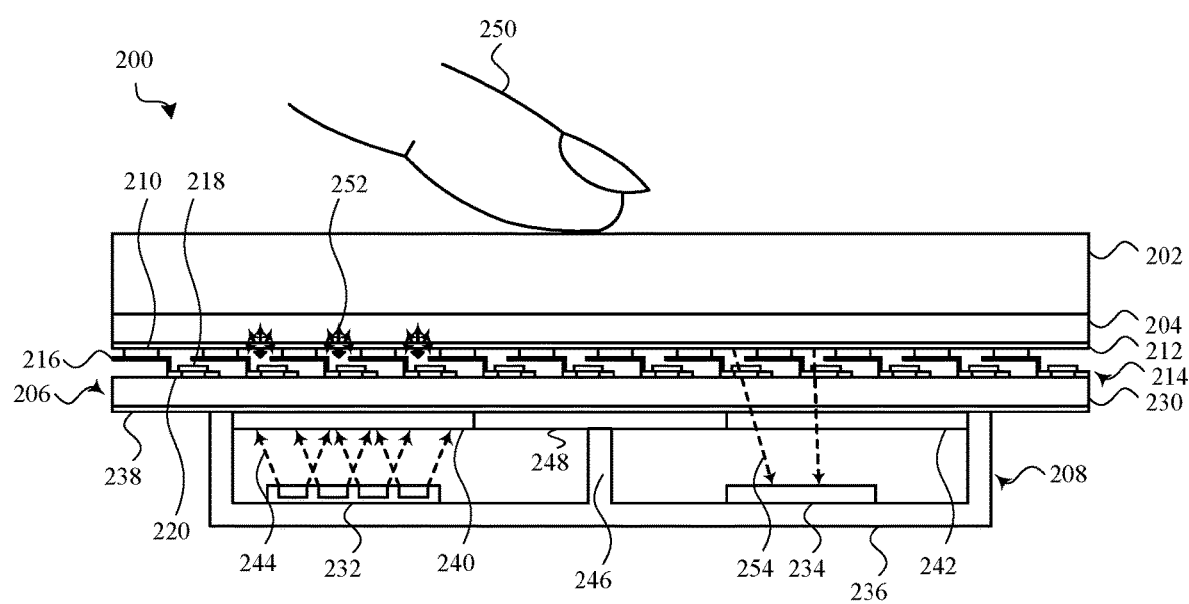
FIGS. 2A and 2B show an example elevation of a display stack including an optical transceiver, and illustrate light that propagates through the display stack.

FIG. 2A shows an example elevation of a display stack 200. The display stack 200 may include a cover 202, a touch sensor 204, a display 206, and/or an optical transceiver 208. The touch sensor 204 may be positioned under the cover 202, the display 206 may be positioned under the touch sensor 204, and the optical transceiver 208 may be positioned under the display 206. In some cases, the display stack 200 may be included in the device 100 described with reference to FIGS. 1A and 1B. With respect to FIG. 2A, "under" means more interior to a device that includes the display stack 200.

The cover 202, touch sensor 204, display 206, and/or optical transceiver 208 may be abutted or attached to one another (e.g., using one or more adhesives or other materials). The cover 202 may include, for example, one or more of glass, a crystal (e.g., sapphire), or a transparent polymer (e.g., plastic) that enables a user to view the display 206 through the cover 202. The cover 202 may be more or less rigid, may provide an exterior surface that a user may touch or press, and may protect the touch sensor 204, display 206, optical transceiver 208 and/or other components that are interior to a device.

The touch sensor 204 may include an array (or grid) of touch sensing elements, with each touch sensing element being configured to generate (or alter) an output signal when the cover 202 is touched at a location above and proximate to the touch sensing element. The touch sensing elements may use capacitive, resistive, ultrasonic, optical, or other touch sensing technologies. Depending on the technology used, the touch sensor 204 may include discrete touch sensing elements (e.g., strain gauges or ultrasonic transceivers) or arrays of elements that cooperate to form touch sensing elements (e.g., first and second layers of electrodes in which a first set of electrodes in a first layer is oriented in a first direction, a second set of electrodes in a second layer is oriented in a second direction, and a different touch sensing element is formed at each location where an electrode in the first set overlaps an electrode in the second set).

The display 206 may be any type of electronic display, such as any of the display types described with reference to FIGS. 1A-1B. By way of example, the display 206 may be an OLED display. In one example of an OLED display, the display 206 may include a set of light-emitting elements 210. Alternatively, the light-emitting elements 210 may include LEDs or other types of light-emitting elements. The light-emitting elements 210 may be arranged in an array having two or more dimensions (e.g., in an array having first and second dimensions that are orthogonal to each other and parallel to the exterior surface of the cover 202; or in a three-dimensional array having first and second dimensions that are orthogonal to each other and parallel to the exterior surface of the cover 202, and a third dimension that is perpendicular the exterior surface of the cover 202). In the case of an OLED display, the light-emitting elements 210 may be formed using an organic material. The light-emitting elements 210 may have the same or different properties, and may be configured (e.g., color filtered) to emit the same or different colors of light. In some embodiments, the light-emitting elements may include red, green, and blue light-emitting elements arranged in accordance with a particular display pixel layout.

The display 206 may include a set of one or more cathodes, which in some cases may take the form of a single planar cathode 212 coupled to first surfaces of the light-emitting elements 210 (e.g., to cover-facing surfaces of the light-emitting elements 210). The display 206 may further include a backplane 214 (or display backplane) that is electrically coupled to second surfaces of the light-emitting elements 210 (e.g., to optical transceiver-facing surfaces of the light-emitting elements 210). The backplane 214 may include a set of anodes 216 coupled to the set of light-emitting elements 210.

The backplane 214 may include a set of transistors 218 and/or other components (e.g., resistors, capacitors, and so on), and a set of conductive metal traces, conductive traces, and/or conductive vias (collectively and generally referred to herein as a set of conductors 220). In some embodiments, the transistors 218 may include TFTs and/or the conductors 220 may include thin film conductors. The conductors 220 may electrically couple the light-emitting elements 210 to the transistors 218 or other components. The conductors 220 may also electrically couple the transistors 218 or other components to each other, to other components within the backplane 214, and/or to other components outside the backplane 214 (e.g., drivers, sensors, converters, controllers, and so on). Each light-emitting element 210 may be coupled to one or more of the conductors 220 at, or via, one of the anodes 216, and each transistor 218 may be coupled to one or more of the conductors 220 at, or via, a conductive pad.

A backfilm 230, such as one or multiple layers of polymer material, may be positioned under the backplane 214. In some cases, the backfilm 230 may function as a substrate on which other layers of the backplane 214 are formed.

The optical transceiver 208 may include an optical transmitter 232 and an optical receiver 234. The optical transmitter 232 may include one or multiple emitters (e.g., one emitter or an array of emitters). The optical receiver 234 may include one or multiple photodetectors, and in some embodiments may include a 2D or 3D camera.

The components 232, 234 of the optical transceiver 208 may be supported by an optical module frame 236 or housing that is abutted to or attached to the backfilm 230. In some embodiments, walls of the frame 236 may be adhesively bonded to the backfilm 230 by an adhesive 238.

Optionally, one or more lenses or other optical elements 240 may be attached to the frame 236 such that they are disposed in an optical emission path of the optical transmitter 232. One or more additional lenses or other optical elements 242 may be attached to the frame 236 such that they are disposed in an optical reception path of the optical receiver 234. The lenses or other optical elements 240, 242 may variously focus, collimate, fan-out, or shape the light 244 emitted by the optical transmitter 232 or the light 254 received by the optical receiver 234. In some embodiments, the optical transmitter 232 and optical receiver 234, and/or the optical elements 240 or 242, may be separated by a light blocking wall 246 or spacer 248 that prevents light 244 emitted by the optical transmitter 232 from impinging directly, or too easily, on the optical receiver 234. Typically, it is desirable for light 244 emitted by the optical transmitter 232 to impinge on an object 250 external to the cover 202 before being reflected or scattered back toward the optical receiver 234.

In operation, the optical transmitter 232 may emit light 244 toward the cover 202, and a portion of the light 244 may pass through the display 206 as light 252. A portion of the light 252 that passes through the display 206 may also pass through the touch sensor 204 and cover 202, and reflect or scatter from the surface of one or more objects 250. The object(s) 250 may be on, near, or far from the exterior surface of the cover 202. A portion of the light that reflects or scatters from the object(s) 250 may pass back through the cover 202, touch sensor 204, and display 206, and may be received by the optical receiver 234.

Figure 2B:
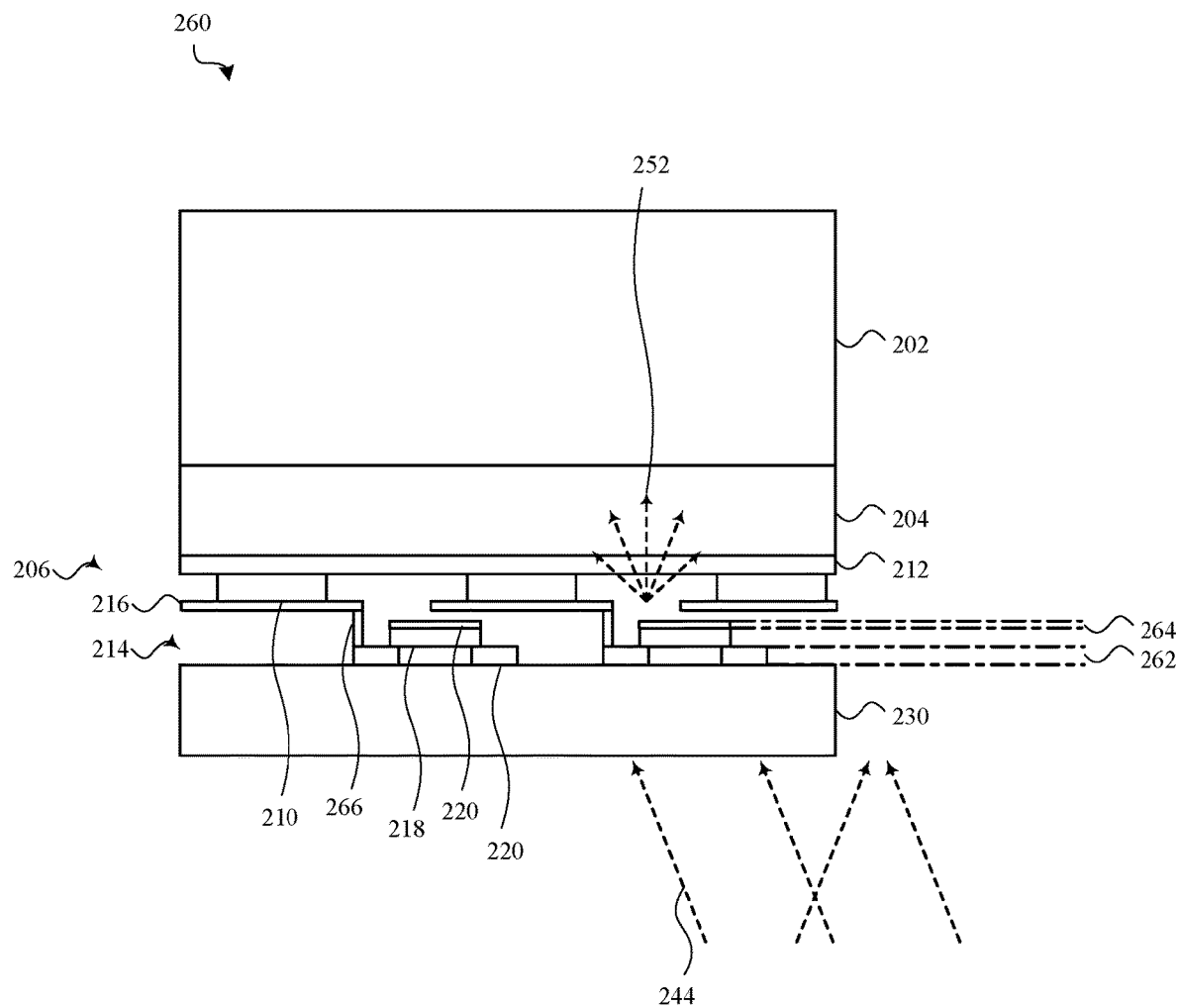

FIG. 2B shows an enlarged portion 260 of the display stack described with reference to FIG. 2A. In particular, FIG. 2B shows an enlarged view of the light-emitting elements 210, anodes 216, transistors 218, and conductors 220 of the display 206.

As shown, the conductors 220 may include a first layer 262 of conductors 220 (or first subset of the conductors 220), a second layer 264 of conductors 220 (or a second subset of the conductors 220), a set of vias 266 that electrically couple the anodes 216 to conductors in the first layer 262 of conductors 220, and/or additional layers or sets of conductors. Each of the transistors 218 may have source and drain terminals that are respectively coupled to a source line or drain line (source/drain lines), and a gate terminal that is coupled to a gate line in the second layer 264 of conductors 220. Each of the light-emitting elements 210, anodes 216, transistors 218, and conductors 220 may be opaque, partially non-transmissive, or laterally non-transmissive to the light 244 emitted by the optical transmitter described with reference to FIG. 2A.

The portion of the light 244 that does not pass through the display 206 may be reflected or scattered within the display 206, or absorbed by various elements within the display 206. Some of the light that is reflected or scattered may impinge on the optical receiver 234 without reflecting off of an object external to the device that includes the display 206.

Figure 3A:
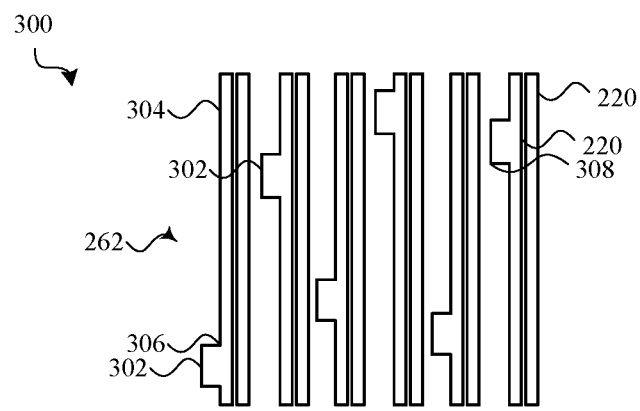
FIGS. 3A-3D show example plan views of various conductors and anodes in a display stack.
Figure 3B:
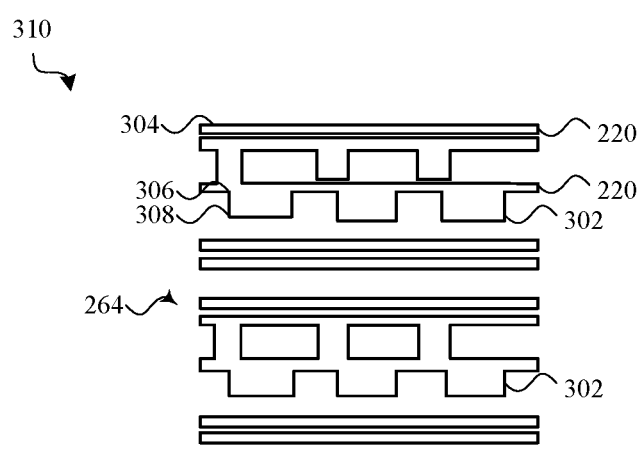
Figure 3C:
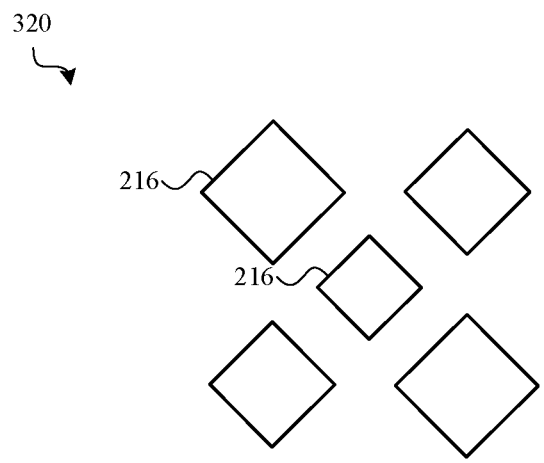
Figure 3D:
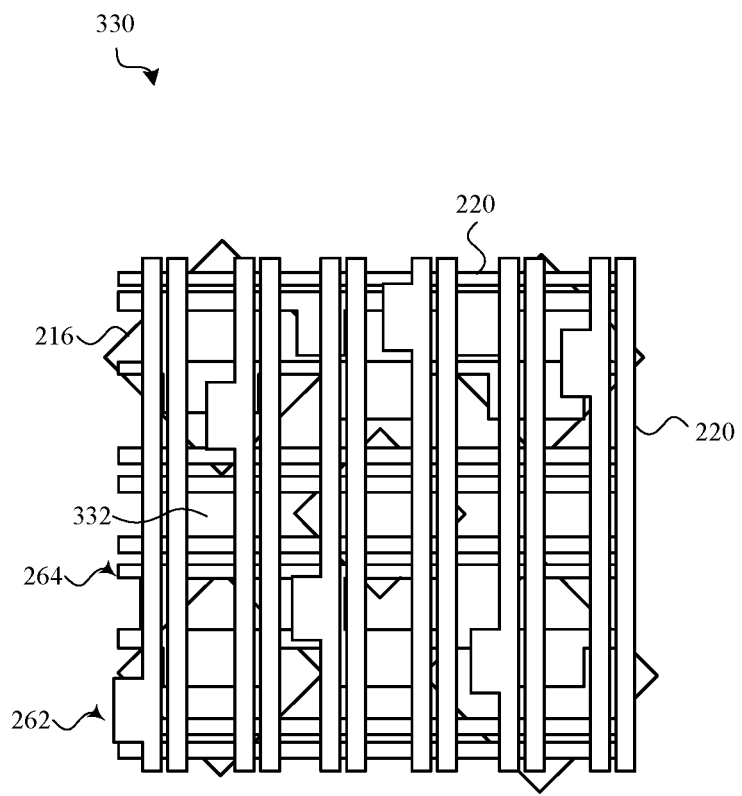

FIGS. 3A-3D show example plan views of various conductors and anodes, which by way of example may be the conductors and anodes described with reference to FIGS. 2A-2B. In particular, FIG. 3A shows an example layout 300 of the first layer 262 of conductors 220 (e.g., source/drain lines); FIG. 3B shows an example layout 310 of the second layer 264 of conductors 220 (e.g., gate lines); and FIG. 3C shows an example layout 320 of the anodes 216. FIG. 3D shows a stackup 330 of the anodes 216, first layer 262, and second layer 264. Each of the conductors 220 may be electrically coupled to, and intersect or overlap, a number of conductive pads 302. Typically, each source/drain line and gate line will be electrically coupled to a plurality of the conductive pads 302.

The construction of the anodes 216, conductors 220, and conductive pads 302 shown in FIGS. 3A-3D is typical, with each of these components having straight and closely spaced parallel edges 304. Furthermore, the interior and exterior corners 306, 308 of the conductive pads 302 and anodes 216 are square, and all of these components (and their features) are laid out in a very repetitive manner. Because the anodes 216, conductors 220, and conductive pads 302 are generally opaque, light that is emitted toward one side of a display stack including these elements may only pass through translucent or transparent areas 332 that exist between the anodes 216, conductors 220, and conductive pads 302. Or, in some cases, light may pass through partially transmissive portions (if any) of the anodes 216, conductors 220, or conductive pads 302. Other portions of the emitted light may diffract, reflect, or scatter, and may not pass through the stack shown in FIG. 3D. In particular, high spatial frequency grating patterns may diffract significant light into large angle components that waveguide through backfilm layers towards one or more optical receivers. In essence, the anodes 216 and conductors 220 function as a highly reflective diffraction grating, which can lead to significant optical crosstalk between the components (e.g., optical transmitter(s) and optical receiver(s)) of an under-display optical transceiver.

Figure 4:
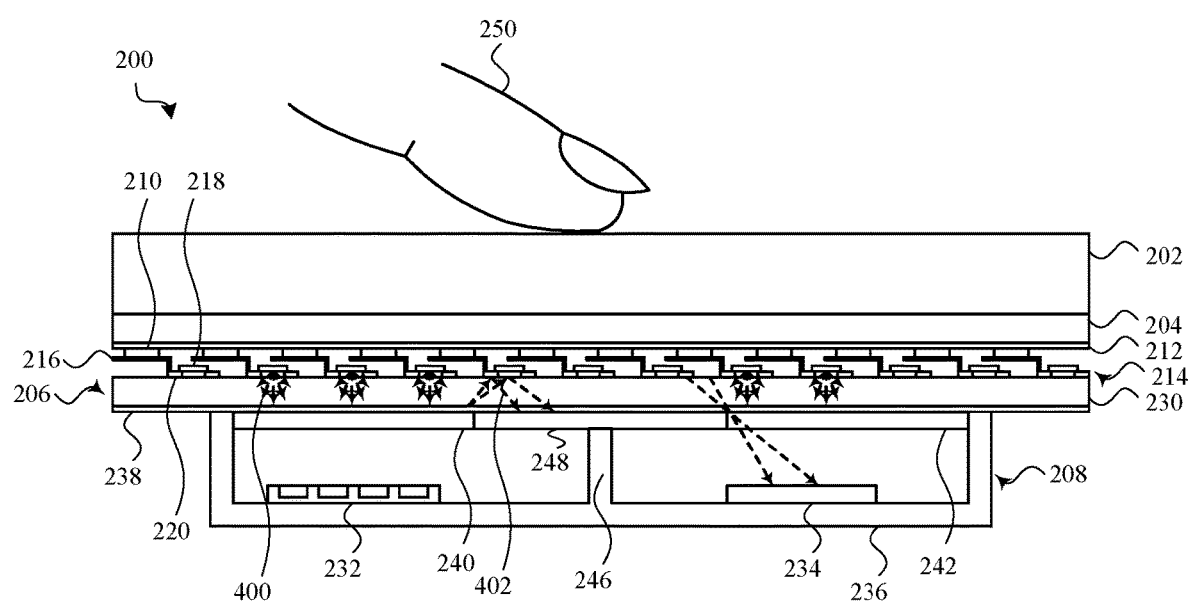
FIG. 4 shows the display stack described with reference to FIGS. 2A-2B, and illustrates light that diffracts around, or reflects or scatters from, various components of the display stack.

FIG. 4 shows the display stack 200 described with reference to FIGS. 2A-2B, but instead of showing the light that is emitted by the optical transmitter 232, passes through the display 206, touch sensor 204, and cover 202, is reflected by an object 250, and is received by the optical transmitter 232, FIG. 4 shows portions 400, 402 of the emitted light that diffract around, or reflect or scatter from, various components of the display stack 200. Some of this light 400, 402 may impinge on the optical receiver 234 without ever exiting the cover 202, and may therefore be considered undesirable optical crosstalk. Suppression of this optical crosstalk, or at least large angle waveguiding components thereof, can provide improved under-display optical transceiver performance. Suppression of optical crosstalk can also improve the performance of an under-display optical receiver (or sensor)—e.g., by improving its dynamic range, resolution, or response time; reducing shot noise; increasing SNR; improving uniformity, such as photon counting uniformity in the case of a SPAD; and so on.

Figure 5A:
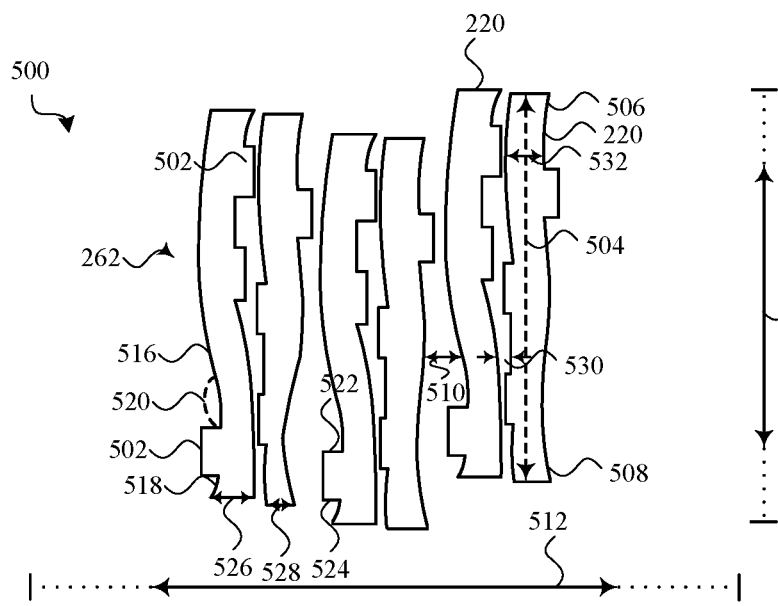
FIGS. 5A-5D show example plan views of various conductors and anodes in a display stack, which conductors and anodes have features designed to reduce or minimize the amount of light that propagates from an under-display optical transmitter to an under-display optical receiver.
Figure 5B:
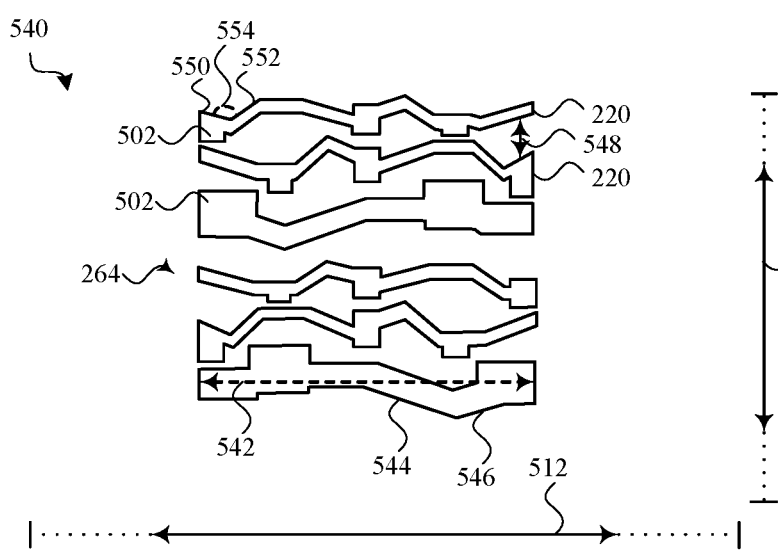
Figure 5C:
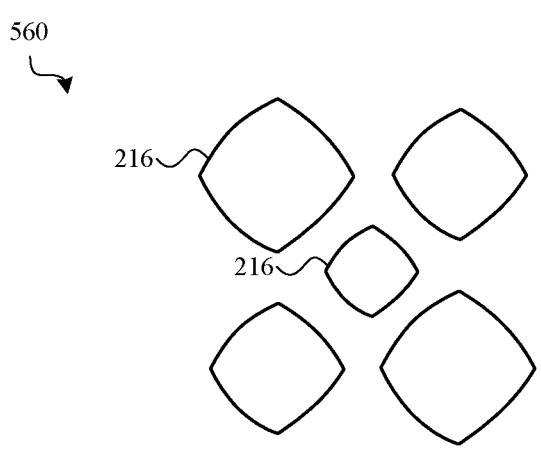
Figure 5D:
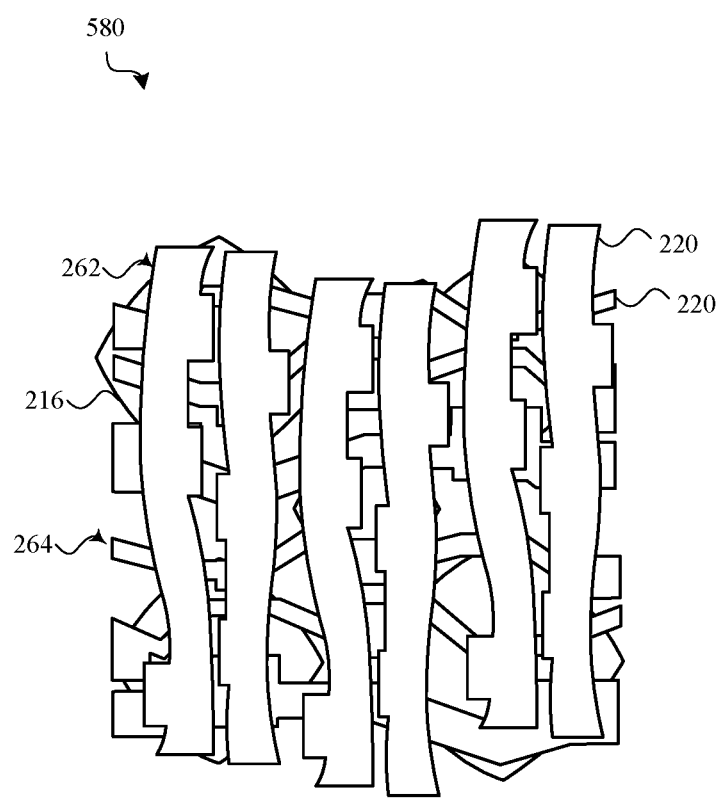

FIGS. 5A-5D show example plan views of various conductors and anodes, which by way of example may be the conductors and anodes described with reference to FIGS. 2A-2B and 4. In particular, FIG. 5A shows an example layout 500 of the first layer 262 of conductors 220 (e.g., source/drain lines); FIG. 5B shows an example layout 540 of the second layer 264 of conductors 220 (e.g., gate lines); and FIG. 5C shows an example layout 560 of the anodes 216, in a third layer that is separate from the first and second layers 262, 264. FIG. 5D shows a stackup 580 of the anodes 216, first layer 262, and second layer 264. Each of the conductors 220 may be electrically coupled to, and intersect or overlap, a number of conductive pads 502. Typically, each source/ drain line and gate line will be electrically coupled to a plurality of the conductive pads 502.

The anodes 216, conductors 220, and conductive pads 502 shown in FIGS. 5A-5D may have non-linear edges (e.g., curved, angular, or otherwise less-straight edges); varying widths; and/or irregular positions, sizes, or shapes of conductive pads 502. Furthermore, the conductors 220 may have different, loose, or varying widths, spacing, or pitch, or other non-uniform and/or varying features. The features and patterns of the anodes 216, conductors 220, and conductive pads 502 may also have less or no repetition in orthogonal (x/y) and diagonal directions. Such features and variations may be designed to suppress or enhance the propagation of diffracted, reflected, and/or scattered light within a display stack.

As shown in FIG. 5A, one or more of the conductors 220 may have a length 504, and a curved edge 506 or 508 extending along at least a portion of the length 504. In some cases, all of the edges of the conductors 220, but for some of the edges defining the conductive pads 502, may be curved. Alternatively, the edges of the conductive pads 502 may also be curved; or only some of the edges along the length 504 and/or some of the edges defining the conductive pads 502 may be curved, and other edges may be straight.

As shown in FIG. 5B, one or more of the conductors 220 may have a length 542, and one or more edges 544, 546 that form non-perpendicular angles with respect to the length 542 (e.g., angled edges). Different edges 544, 546 may form different non-perpendicular angles with respect to the length 542. In some cases, all of the edges of the conductors 220, but for some of the edges defining the conductive pads 502, may form non-perpendicular angles with respect to the length 542. Alternatively, the edges of the conductive pads 502 may also form non-perpendicular angles with respect to the length 542; or only some of the edges along the length 542 and/or some of the edges defining the conductive pads 502 may form non-perpendicular angles with respect to the length 542, and other edges may be perpendicular or parallel to the length 542.

In some embodiments, and as shown in FIGS. 5A-5B, adjacent conductors (e.g., adjacent first and second conductors 220) may have a spacing 510 or 548 that varies along their lengths. In some embodiments, their spacing may vary by at least 5%. In other embodiments, their spacing 510 or 548 may vary up to 100%, up to 200%, or by any amount. In some embodiments, an irrational ratio of change (avoiding a common denominator) may be useful.

Each of the conductors 220 may be positioned under an array of light-emitting elements. The array of light-emitting elements may have a first dimension 512 and a second dimension 514, with the first and second dimensions 512, 514 being orthogonal to each other and parallel to the array of light-emitting elements. Each of the conductors 220 may further have first and second ends, with the first and second ends being aligned in one of the first dimension 512 or the second dimension 514. For purposes of this disclosure, "aligned ends" means that a straight line passes through a portion of each end. Aligned ends may be partially aligned or fully aligned. In some embodiments, the ends of a conductor 220 may not be aligned.

In some embodiments, and as also shown in FIGS. 5A-5B, different portions (e.g., first and second portions 516 and 518, or 550 and 552) of a conductor 220 may form an obtuse angle 520 or 554. In some embodiments, the combined length of the first portion and the second portion (516 and 518, or 550 and 552) may be greater than a width of the first portion or the second portion.

In some embodiments, one or more of the conductors 220 shown in FIGS. 5A-5B may approach different edges 522, 524 of a conductive pad 502 at different angles. See, for example, FIG. 5A. In the same or different embodiments, one or more of the conductors 220 may approach a first conductive pad 502 at a first angle, and approach a second conductive pad 502 at a second angle.

In some embodiments, a first conductor 220 may have a first cross-section; a second conductor 220, adjacent the first conductor 220, may have a second cross-section; and the first cross-section may have a first width 526 that differs from a second width 528 of the second cross-section.

In some embodiments, and as shown in FIGS. 5A-5B, first, second, and third conductors may be positioned adjacent one another, with the second conductor 220 disposed between the first and third conductors 220, and a first spacing 510 between the first and second conductors 220 may vary differently than a second spacing 530 between the second and third conductors.

In some embodiments, a conductor 220 may have a length 504 and a width 532, and the width 532 may vary along the length 504. In some embodiments, one or more of the conductors 220 may have a lateral wander that spans at least 125% of the conductor's average width. In other embodiments, the lateral wander may range from 1% to over 100%. In some embodiments, an irrational ratio of change may be useful—e.g., wandering by 23%, 41%, etc.

The conductors 220 shown in FIG. 5A may be arranged in a first layer 262, and the conductors 220 shown in FIG. 5B may be arranged in a second layer 264. As shown in FIG. 5D, the first and second layers of conductors 220 may be stacked, with each conductor 220 in the first set overlapping multiple conductors 220 in the second set, and each conductor 220 in the second set overlapping multiple conductors 220 in the first set. In some embodiments, a first conductor 220 in the first set and a second conductor 220 in the second set may have edges that overlap at a non-perpendicular angle. In some embodiments, the non-perpendicular angle may be between 45 and 135 degrees.

The various curved, angled, and/or varying features of the conductors 220 and anodes 216 may be used to suppress or enhance the diffraction, reflection, and/or scatter of light that is emitted toward a display through the stackup (or display stack) 580.

FIGS. 6A-6F show various example placements of optical transceiver components under a display stack, and illustrate how the curved, angled, and/or varied features of conductors and anodes within a display stack, and/or the orientations of such elements, may suppress or enhance the diffraction, reflection, and/or scatter of light in one or more directions.

Figure 6A:
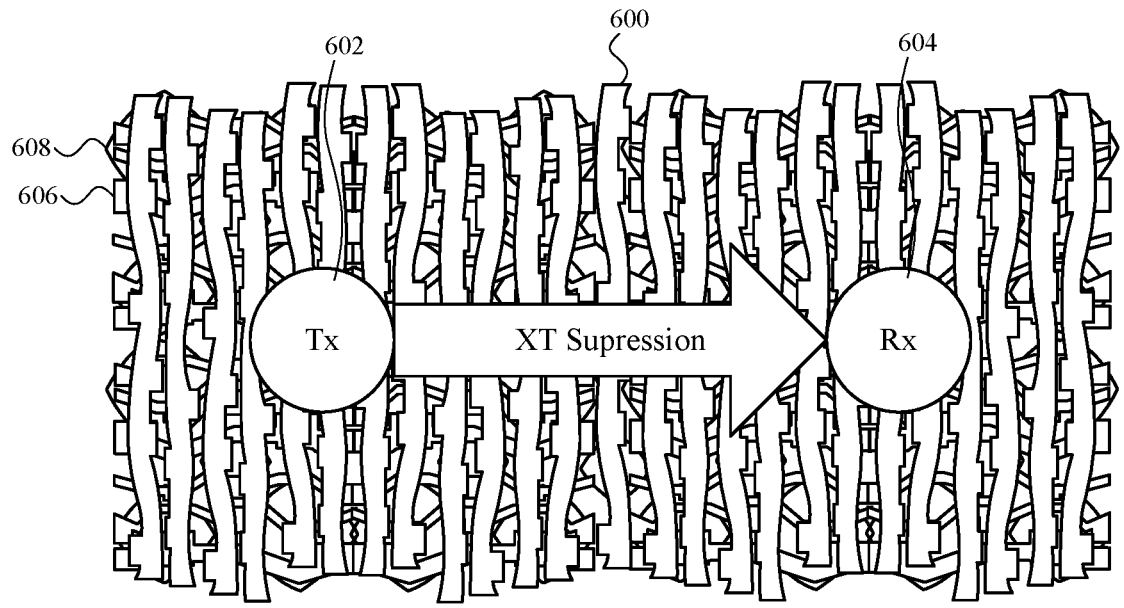
FIGS. 6A-6F show various example placements of optical transceiver components under a display stack, and illustrate how curved, angled, and/or varied features of conductors and anodes within a display stack, and/or the orientations of such elements, may suppress or enhance the diffraction, reflection, and/or scatter of light in one or more directions.

FIG. 6A shows source/drain lines 600 having lengths that extend in a first direction, and components of an optical transceiver (e.g., an optical transmitter 602 and optical receiver 604) that are spaced apart from each other and the source/drain lines 600 along a second direction, orthogonal to the first direction. One or more of the source/drain lines 600 have curved edges that extend between, and are offset from, the optical transmitter 602 and optical receiver 604. The curved edges may aid in suppressing optical crosstalk between the optical transmitter 602 and optical receiver 604 (e.g., reduce or minimize the amount of light that propagates from the optical transmitter 602 to the first optical receiver 604 without first exiting the device that includes the source/drain lines 600). Features and/or orientations of the gate lines 606 and anodes 608 may also aid in suppressing optical crosstalk between the optical transmitter 602 and optical receiver 604.

Figure 6B:
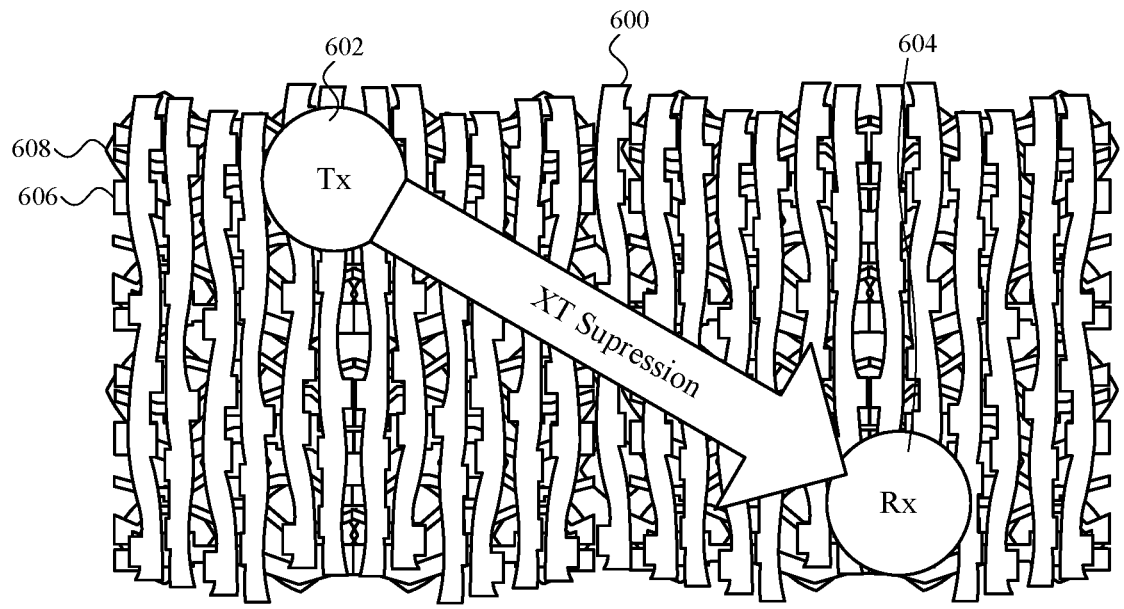

FIG. 6B shows the source/drain lines 600, gate lines 606, and anodes 608 described with reference FIG. 6A, but shows the optical transmitter 602 and optical receiver 604 spaced apart from each other along a second direction that forms a diagonal with respect to the first direction of the source/drain lines 600. By way of example, the diagonal is shown to be a 45 degree diagonal. Another useful diagonal angle is 22.5 degrees. In other embodiments, the optical transmitter 602 and optical receiver 604 may be spaced apart from each other in any direction, whether orthogonal or non-orthogonal (and even parallel) to the source/drain lines 600 (i.e., in a direction that forms any angle with respect to, or is parallel to, the source/drain lines 600), or orthogonal or non-orthogonal (and even parallel) to the gate lines 606 (i.e., in a direction that forms any angle with respect to, or is parallel to, the gate lines 606). In general, the optical transmitter 602 and optical receiver 604 may be spaced apart from each other along any direction in which a display topology provides lower spatial frequencies.

Figure 6C:
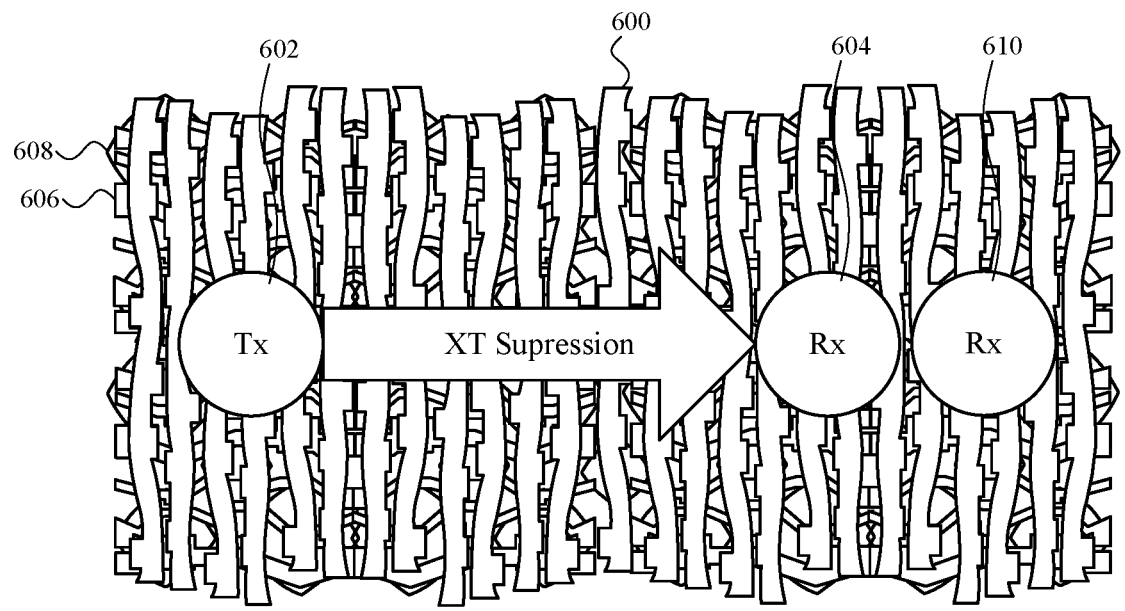
Figure 6D:
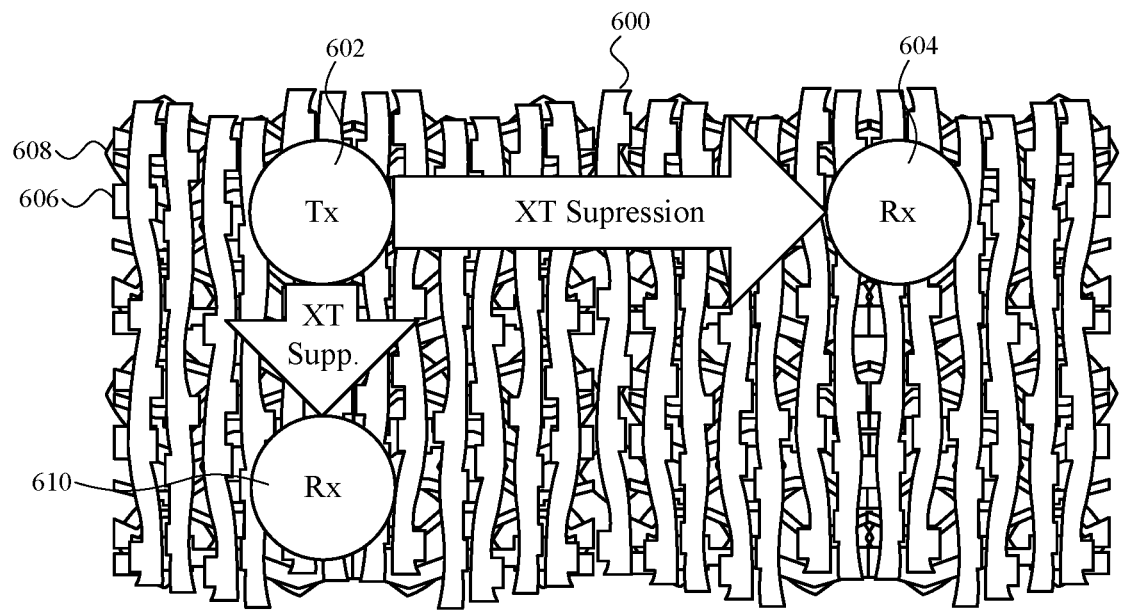

FIGS. 6C and 6D show the placement of an additional optical receiver 610 under the source/drain lines 600. With respect to the view shown in FIGS. 6C-6D (and all of FIGS. 6A-6F), note that the view of each figure is presented from the vantage point of looking up through a display stack, such that the transceiver components shown on top of each figure are actually "under" a display and other components of the display stack.

In FIG. 6C, the additional optical receiver 610 is spaced apart from the first optical receiver 604 along the second direction described with reference to FIG. 6A, with both optical receivers 604, 610 being disposed on one side of the optical transmitter 602. In FIG. 6D, the additional optical receiver 610 is spaced apart from the optical transmitter 602 along the first direction described with reference to FIG. 6A. In both embodiments, the curved edges of the source/drain lines 600 may aid in suppressing optical crosstalk between the optical transmitter 602 and the optical receivers 604, 610 (e.g., reduce or minimize the amount of light that propagates from the optical transmitter 602 to the first optical receiver 604 without first exiting the device that includes the source/drain lines 600). Features and/or orientations of the gate lines 606 and anodes 608 may also aid in suppressing optical crosstalk between the optical transmitter 602 and optical receivers 604, 610.

Figure 6E:
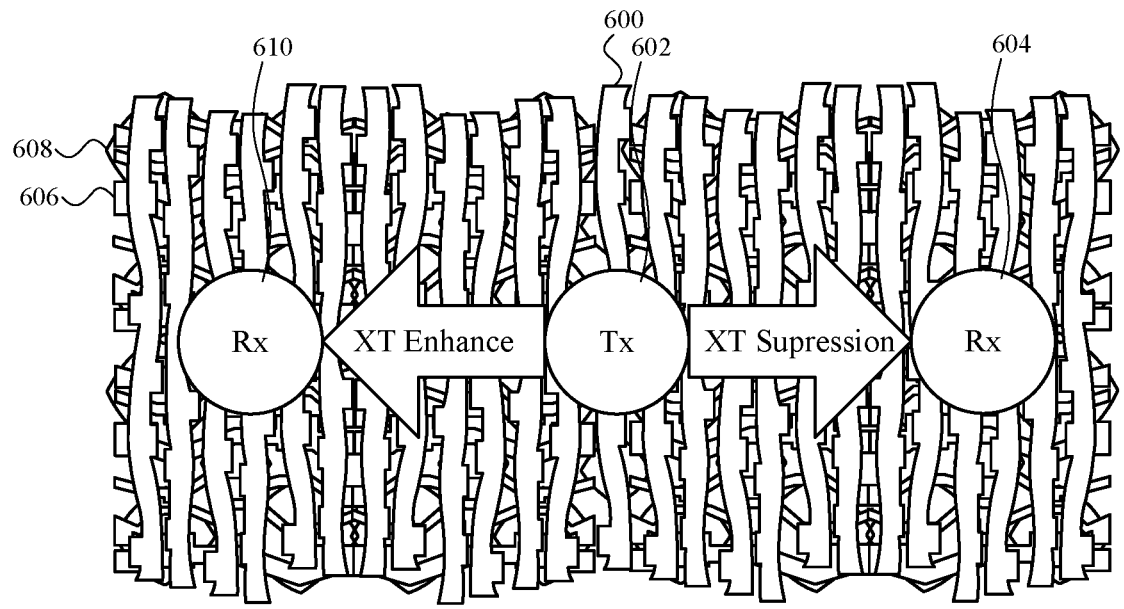
Figure 6F:
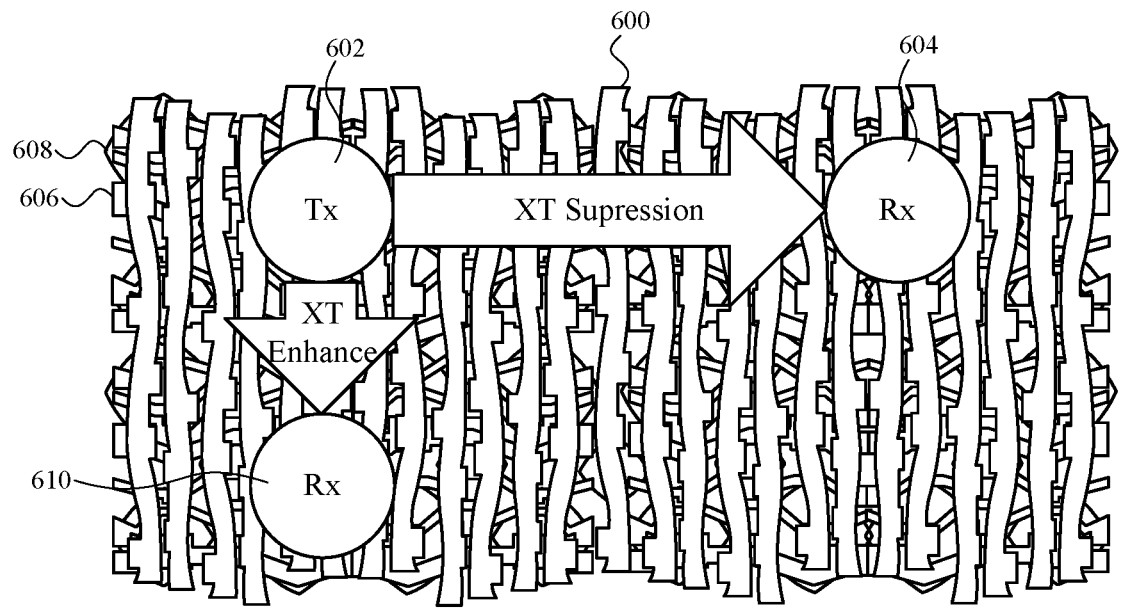

FIGS. 6E and 6F also show the placement of an additional receiver 610 under the source/drain lines 600. In FIG. 6E, the additional optical receiver 610 is spaced apart from the first optical receiver 604 along the second direction described with reference to FIG. 6A, with the optical receivers 604, 610 being disposed on opposite sides of the optical transmitter 602. In FIG. 6F, the additional optical receiver 610 is spaced apart from the optical transmitter 602 along the first direction described with reference to FIG. 6A. In both embodiments, the curved edges may aid in suppressing optical crosstalk between the optical transmitter 602 and the first optical receiver 604 (e.g., reduce or minimize the amount of light that propagates from the optical transmitter 602 to the first optical receiver 604 without first exiting the device that includes the source/drain lines 600), but enhance optical crosstalk between the optical transmitter 602 and the second optical receiver 610. Features and/or orientations of the gate lines 606 and anodes 608 may also aid in suppressing or enhancing optical crosstalk between the optical transmitter 602 and optical receivers 604, 610.

In the embodiments described with reference to FIGS. 6E and 6F, differences between the outputs of the first and second optical receivers 604, 610, caused by suppression or enhancement of optical crosstalk, may be used to estimate how much optical crosstalk is affecting the first and/or second optical receiver, so that an optical crosstalk baseline may be subtracted from the signal(s) generated by the first and/or second optical receiver 604, 610 (e.g., the difference in optical crosstalk may be used to calibrate the components of an optical transceiver).

In some embodiments, the source/drain lines 600, gate lines 606, and anodes 608 shown in FIGS. 6A-6F may be examples of the conductors 220 described with reference to FIGS. 2A-5D. In some embodiments, the optical transmitter 602 and optical receivers 604, 610 described with reference to FIGS. 6C-6F may be spaced apart in other directions, as described, for example, with reference to FIG. 6B.

Figure 7:
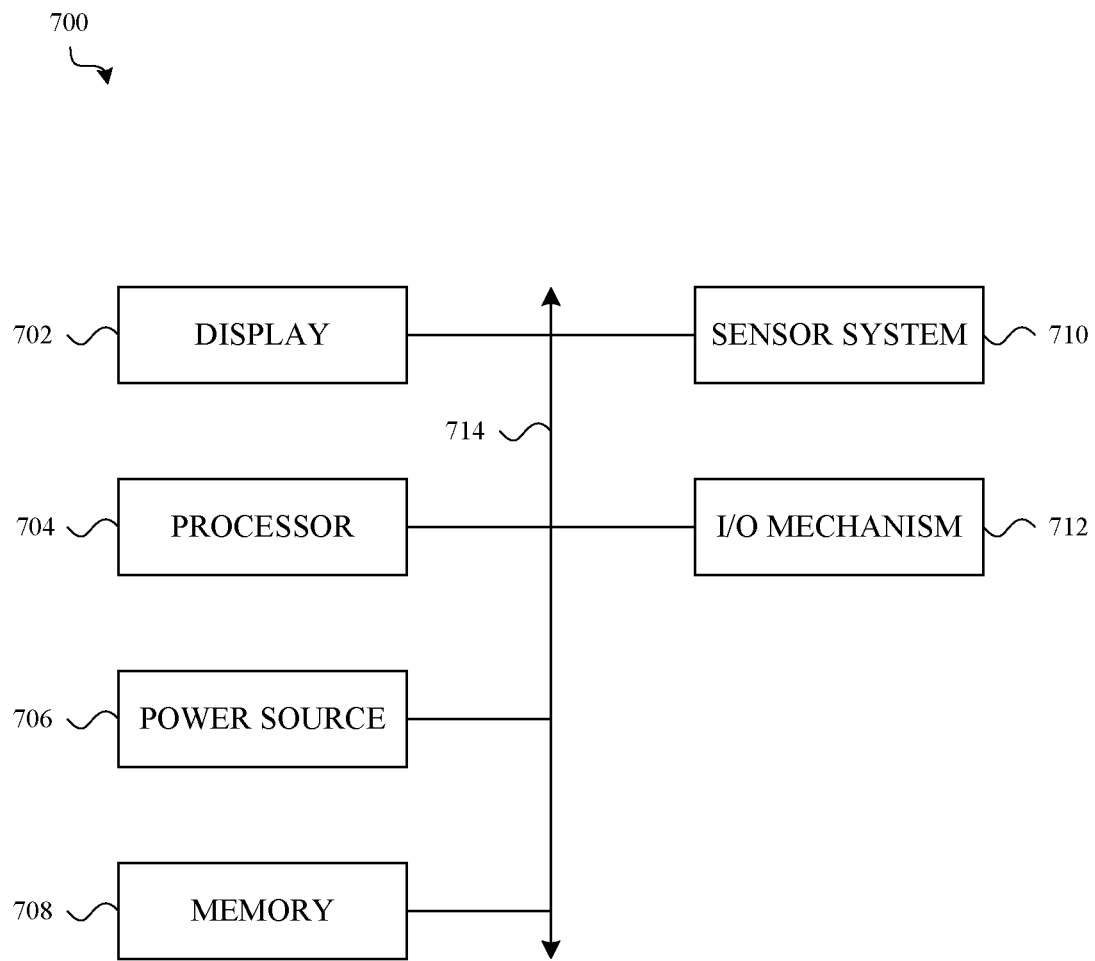
FIG. 7 shows an example electrical block diagram of an electronic device.

FIG. 7 shows a sample electrical block diagram of an electronic device 700, which electronic device may in some cases take the form of the device described with reference to FIGS. 1A and 1B and/or have a display stack or under-display optical transceiver as described with reference to FIGS. 1A-6F. The electronic device 700 may include a display 702 (e.g., a light-emitting display), a processor 704, a power source 706, a memory 708 or storage device, a sensor system 710, or an input/output (I/O) mechanism 712 (e.g., an input/output device, input/output port, or haptic input/output interface). The processor 704 may control some or all of the operations of the electronic device 700. The processor 704 may communicate, either directly or indirectly, with some or all of the other components of the electronic device 700. For example, a system bus or other communication mechanism 714 can provide communication between the display 702, the processor 704, the power source 706, the memory 708, the sensor system 710, and the I/O mechanism 712.

The processor 704 may be implemented as any electronic device capable of processing, receiving, or transmitting data or instructions, whether such data or instructions is in the form of software or firmware or otherwise encoded. For example, the processor 704 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 700 can be controlled by multiple processors. For example, select components of the electronic device 700 (e.g., the sensor system 710) may be controlled by a first processor and other components of the electronic device 700

(e.g., the display 702) may be controlled by a second processor, where the first and second processors may or may not be in communication with each other.

The power source 706 can be implemented with any device capable of providing energy to the electronic device 700. For example, the power source 706 may include one or more batteries or rechargeable batteries. Additionally or alternatively, the power source 706 may include a power connector or power cord that connects the electronic device 700 to another power source, such as a wall outlet.

The memory 708 may store electronic data that can be used by the electronic device 700. For example, the memory 708 may store electrical data or content such as, for example, audio and video files, documents and applications, device settings and user preferences, timing signals, control signals, and data structures or databases. The memory 708 may include any type of memory. By way of example only, the memory 708 may include random access memory, read-only memory, Flash memory, removable memory, other types of storage elements, or combinations of such memory types.

The electronic device 700 may also include one or more sensor systems 710 positioned almost anywhere on the electronic device 700. However, at least one optical transceiver may be positioned under the display 702, and may be configured to transmit and receive light through the display 702. The sensor system(s) 710 may be configured to sense one or more types of parameters, such as but not limited to, light; touch; force; heat; movement; relative motion; biometric data (e.g., biological parameters) of a user; proximity of an object; depth of an object; and so on. By way of example, the sensor system(s) 710 may include a heat sensor, a position sensor, a light or optical sensor (e.g., an optical transceiver), an accelerometer, a pressure transducer, a gyroscope, a magnetometer, a health monitoring sensor, and so on. Additionally, the one or more sensor systems 710 may utilize any suitable sensing technology, including, but not limited to, capacitive, ultrasonic, resistive, optical, ultrasound, piezoelectric, and thermal sensing technology.

The I/O mechanism 712 may transmit or receive data from a user or another electronic device. The I/O mechanism 712 may include the display 702, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 712 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A display stack, comprising:
a display including a set of light-emitting elements;
a display backplane, electrically coupled to the set of light-emitting elements and including a set of conductors; and
an optical transceiver positioned behind the display and including an optical transmitter and an optical receiver; wherein,
a conductor in the set of conductors has,
a length; and
a curved edge extending along at least a portion of the length; and
light emitted by the optical transmitter impinges on the curved edge, the curved edge suppressing or enhancing optical crosstalk between the optical transmitter and the optical receiver.

2. The display stack of claim 1, wherein:
the conductor is a first conductor, and the length is a first length;
the set of conductors comprises a second conductor;
the second conductor is adjacent the first conductor; and
a spacing between the first conductor and the second conductor varies by at least 5%.

3. The display stack of claim 1, wherein:
the length of the conductor includes a first portion coupled to a second portion; and
the second portion forms an obtuse angle with respect to the first portion.

4. The display stack of claim 3, wherein:
the set of light-emitting elements is arranged in an array having a first dimension orthogonal to a second dimension;
the conductor has a first end and a second end; and
the first end and the second end are aligned in the first dimension or the second dimension.

5. The display stack of claim 3, wherein a combined length of the first portion and the second portion is greater than a width of the first portion or the second portion.

6. The display stack of claim 1, wherein the conductor is one of a source/drain line or a gate line.

7. The display stack of claim 1, wherein:
the length of the conductor extends in a first direction;
the optical transmitter is spaced apart from the optical receiver along a second direction, orthogonal to the first direction; and
the curved edge extends between, and is offset from, the optical transmitter and the optical receiver.

8. The display stack of claim 1, wherein:
the length of the conductor extends in a first direction; and
the optical transmitter is spaced apart from the optical receiver along the first direction.

9. A display stack, comprising:
a set of light-emitting elements;
a set of transistors, electrically coupled to the set of light-emitting elements; and
a set of conductors, electrically coupled to the set of transistors; wherein,
the set of transistors is electrically coupled to the set of conductors at a set of conductive pads;
a plurality of conductive pads in the set of conductive pads is coupled to a single conductor in the set of conductors;
the single conductor approaches a first conductive pad in the plurality of conductive pads at a first angle; and the single conductor approaches a second conductive pad in the plurality of conductive pads at a second angle different from the first angle.

10. The display stack of claim 9, wherein the set of conductors comprises:
a first set of conductors disposed in a first layer; and
a second set of conductors disposed in a second layer; wherein,
each conductor in the first set overlaps multiple conductors in the second set.

11. The display stack of claim 9, wherein:
the single conductor is a first conductor;
the set of conductors includes a second conductor adjacent the first conductor;
the first conductor has a first cross-section, and the first cross-section is adjacent a second cross-section of the second conductor; and
the first cross-section has a first width that differs from a second width of the second cross-section.

12. The display stack of claim 9, wherein:
the single conductor is a first conductor;
the set of conductors includes a second conductor and a third conductor;
the second conductor is disposed between the first conductor and the third conductor; and
a first spacing between the first conductor and the second conductor varies differently than a second spacing between the second conductor and the third conductor.

13. The display stack of claim 9, wherein:
the single conductor has a length and a width; and
the width varies along the length.

14. An electronic device, comprising:
a display including a set of light-emitting elements;
a display backplane, electrically coupled to the set of light-emitting elements and including,
a first set of conductors disposed in a first layer;
a second set of conductors disposed in a second layer; and
a set of anodes disposed in a third layer; and
an optical transceiver positioned behind the display backplane, the optical transceiver including an optical transmitter and an optical receiver; wherein,
the first layer, the second layer, and the third layer are stacked;
a first conductor in the first set and a second conductor in the second set have edges that overlap at a non-perpendicular angle; and
an anode in the set of anodes has at least one non-linear edge, the at least one non-linear edge suppressing or enhancing optical crosstalk between the optical transmitter and the optical receiver.

15. The electronic device of claim 14, further comprising:
a set of transistors; wherein,
conductors in the first set of conductors are electrically coupled to sources or drains of transistors in the set of transistors; and
conductors in the second set of conductors are electrically coupled to gates of the transistors in the set of transistors.

16. The electronic device of claim 14, wherein:
at least one conductor in the first set of conductors or the second set of conductors has,
an average width; and
a lateral wander spanning at least 125% of the average width.

\* \* \* \* \*